United States Patent
Hung et al.

(10) Patent No.: US 12,211,838 B2
(45) Date of Patent: Jan. 28, 2025

(54) DEVICE INCLUDING MIM CAPACITOR AND RESISTOR

(71) Applicant: Taiwan Semiconductor Manufacturing Co., Ltd., Hsin-Chu (TW)

(72) Inventors: Chen-Hsiang Hung, Hsin-Chu (TW); Li-Hsin Chu, New Taipei (TW); Chia-Ping Lai, Hsinchu (TW); Chung-Chuan Tseng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 18/232,736

(22) Filed: Aug. 10, 2023

(65) Prior Publication Data
US 2023/0395595 A1    Dec. 7, 2023

Related U.S. Application Data

(60) Continuation of application No. 17/508,470, filed on Oct. 22, 2021, now Pat. No. 11,756,955, which is a
(Continued)

(51) Int. Cl.
*H01L 27/07*    (2006.01)
*H01L 23/532*    (2006.01)
(Continued)

(52) U.S. Cl.
CPC ...... *H01L 27/0794* (2013.01); *H01L 23/5329* (2013.01); *H01L 27/016* (2013.01);
(Continued)

(58) Field of Classification Search
CPC ............ H01L 23/5223; H01L 27/0682; H01L 27/0794; H01L 21/707; H01L 21/76885; H01L 27/01; H01L 21/76802; H01L 21/7687; H01L 21/76805; H01L 21/76895; H01L 21/76829
See application file for complete search history.

(56) References Cited

U.S. PATENT DOCUMENTS 9,064,719 B1    6/2015    Zhou et al.
9,275,992 B1    3/2016    Tarabbia et al.
(Continued)

FOREIGN PATENT DOCUMENTS

KR    100794155 B1    1/2008
KR    1020150051179 A    5/2015

OTHER PUBLICATIONS

Offical Action issued Jun. 12, 2019, in corresponding Taiwan Patent Application No. 10820545630.

*Primary Examiner* — Raj R Gupta
(74) *Attorney, Agent, or Firm* — Duane Morris LLP

(57) ABSTRACT

A method of making a semiconductor device, includes: providing a first dielectric layer; sequentially forming a first metal layer, a dummy capacitor dielectric layer, and a second metal layer over the first dielectric layer; and using a single mask layer with two patterns to simultaneously recess two portions of the second metal layer so as to define a metal thin film of a resistor and a top metal plate of a capacitor.

20 Claims, 10 Drawing Sheets

Related U.S. Application Data division of application No. 15/965,672, filed on Apr. 27, 2018, now abandoned.

(60) Provisional application No. 62/585,445, filed on Nov. 13, 2017.

(51) Int. Cl.
*H01L 27/01* (2006.01)
*H01L 27/06* (2006.01)
*H01L 49/02* (2006.01)

(52) U.S. Cl.
CPC .......... *H01L 27/0682* (2013.01); *H01L 28/20* (2013.01); *H01L 28/60* (2013.01)

(56) References Cited

U.S. PATENT DOCUMENTS

| | | |
|---|---|---|
| 2003/0017699 A1 | 1/2003 | Zurcher et al. |
| 2005/0062130 A1 | 3/2005 | Ciancio et al. |
| 2005/0212082 A1 | 9/2005 | Takeda et al. |
| 2006/0214265 A1 | 9/2006 | Goebel et al. |
| 2008/0001256 A1* | 1/2008 | Remmel ............ H01L 23/5228 257/533 |
| 2014/0264751 A1 | 9/2014 | Chen et al. |
| 2015/0108607 A1* | 4/2015 | Chen .................. H01L 23/5228 257/533 |
| 2015/0123242 A1 | 5/2015 | Jen et al. |
| 2015/0221716 A1 | 8/2015 | Jakushokas et al. |
| 2019/0019858 A1 | 1/2019 | Ali et al. |

* cited by examiner

DEVICE INCLUDING MIM CAPACITOR AND RESISTOR

CROSS-REFERENCE TO RELATED APPLICATION

This application is a continuation of U.S. patent application Ser. No. 17/508,470, filed Oct. 22, 2021, which is a division of U.S. patent application Ser. No. 15/965,672, filed Apr. 27, 2018 which claims priority to U.S. Provisional Patent Application No. 62/585,445, filed on Nov. 13, 2017, each of which are incorporated by reference herein in their entireties.

BACKGROUND

Capacitors and resistors are standard components in many semiconductor integrated circuits. For example, the capacitor can be used in in various radio frequency (RF) circuits (e.g., an oscillator, phase-shift network, filter, converter, etc.), in dynamic random-access memory (DRAM) cells, and as a decoupling capacitor in high power microprocessor units (MPUs); and the resistor is typically used together with the capacitor to control respective resistances of other electronic components of at least one the above-mentioned circuits.

Typically, the capacitor is implemented by a metal-insulator-metal (MIM) structure (hereinafter "MIM capacitor"), which includes two metal plates and an insulator sandwiched therebetween serving as a capacitor dielectric layer; and the resistor is implemented by a metal thin film resistor with a low temperature coefficient of resistivity (TCR) (hereinafter "low TCR metal resistor"). Various reasons are present to implement the capacitor and resistor as the MIM capacitor and low TCR metal resistor, respectively, over other capacitor and resistor structures (or materials). For example, compared to a MOS (metal-oxide-semiconductor) capacitor consisting of one semiconductor electrode and a metal plate, under a same area, a MIM capacitor can provide a larger capacitance, which is typically desirable in various circuits, than that of a MOS capacitor. And, although other thin film resistors that are not made of metal, e.g., polysilicon, may also present a low TCR, when compared to the metal thin film resistor, such a non-metal thin film resistor typically presents a tighter (i.e., narrower) sheet resistance tolerance, which disadvantageously limits its usage.

Conventionally, when making the MIM capacitor that is compatible with complementary metal-oxide-semiconductor (CMOS) technologies, at least one extra photolithography step is required to make (e.g., define) the low TCR metal resistor, which may accordingly increases fabrication cost/resource/time. Therefore, conventional MIM capacitors and low TCR metal resistors, and methods to form the same are entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

Figure 1A:
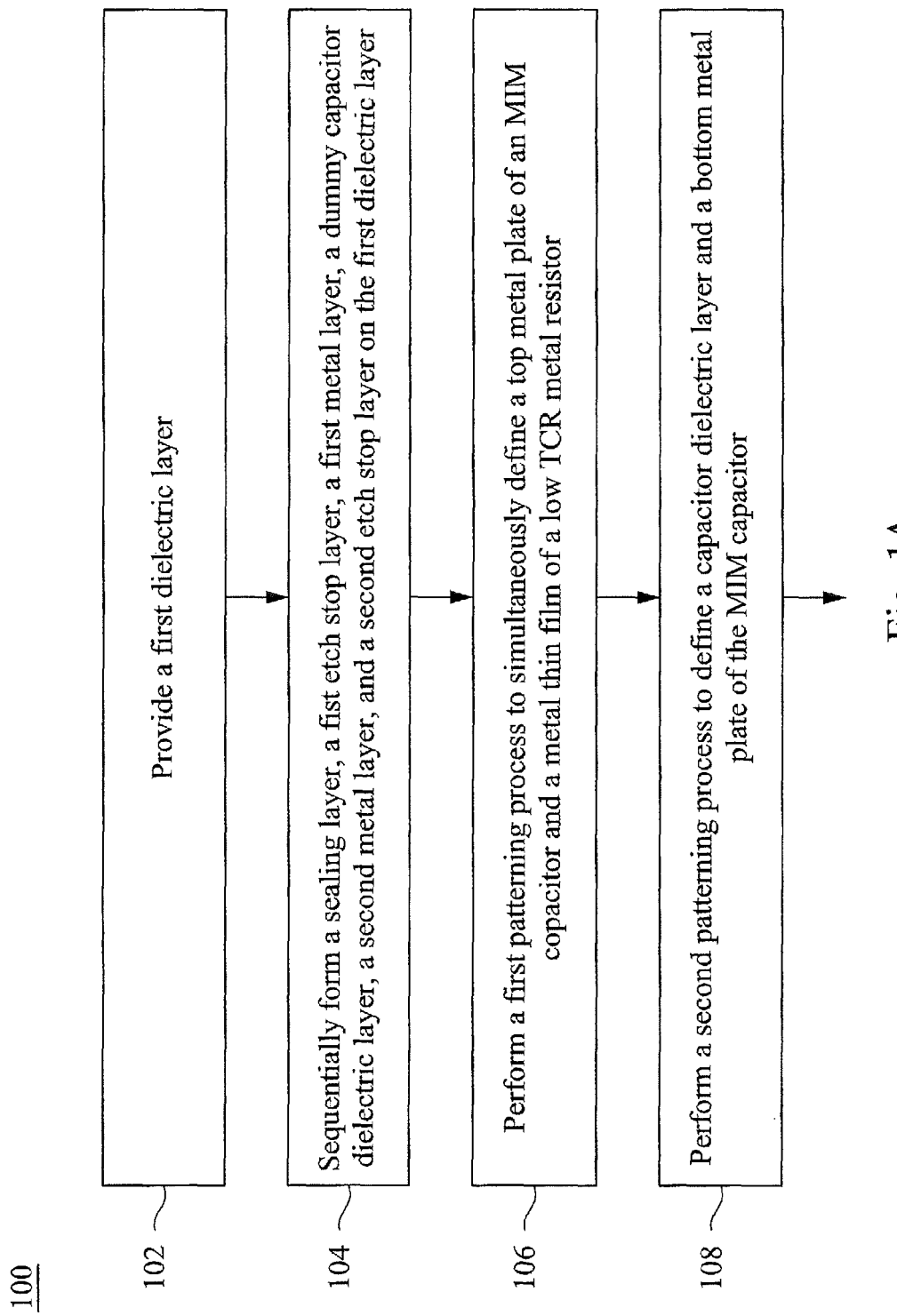
FIGS. 1A and 1B illustrate a flow chart of an exemplary method for forming a semiconductor device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a semiconductor device including at least one capacitor and at least one thin film resistor that are concurrently defined during a common patterning step (e.g., a photolithography process). In some embodiments, the capacitor may be a MIM (metal-insulator-metal) capacitor, and the thin film resistor may be a low TCR (temperature coefficient of resistivity) metal resistor. In some embodiments, one of the metal plates (e.g., a top metal plate) of the MIM capacitor and a metal thin film of the low TCR metal resistor are concurrently defined during the common patterning step. More specifically, in some embodiments, the top metal plate of the MIM capacitor and the metal thin film of the low TCR metal resistor are formed by patterning (e.g., etching) a same metal layer using respective different patterns contained in a same mask layer during the common patterning step. As such, the above-mentioned issue (i.e., the requirement of at least one extra photolithography step) may be advantageously avoided while making a semiconductor device including a MIM capacitor and a low TCR metal resistor.

Figure 1B:
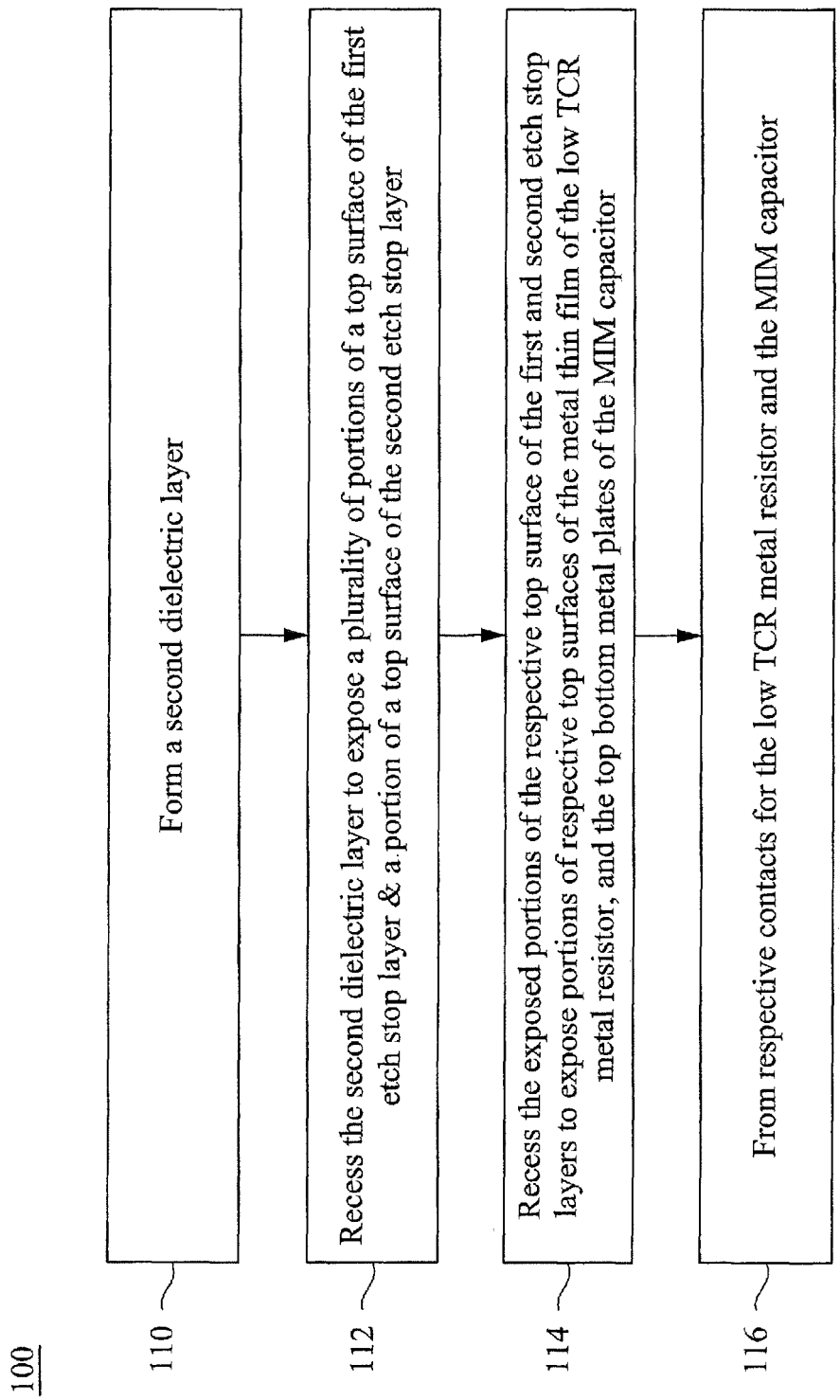

FIGS. 1A and 1B illustrate a flowchart of a method 100 to form a semiconductor device, including at least one MIM capacitor and one low TCR metal resistor, according to one or more embodiments of the present disclosure. It is noted that the method 100 is merely an example, and is not intended to limit the present disclosure. Accordingly, it is understood that additional operations may be provided before, during, and after the method 100 of FIGS. 1A and 1B, and that some other operations may only be briefly described herein. In some embodiments, operations of the method 100 may be associated with cross-sectional views of a semiconductor device at various fabrication stages as shown in FIGS. 2A, 2B, 2C, 2D, 2E, 2F, 2G, and 2H, respectively, which will be discussed in further detail below.

Referring now to FIGS. 1A and 1B, the method 100 starts with operation 102 in which a first dielectric layer is provided. In some embodiments, the first dielectric layer may be an inter-layer dielectric (ILD) layer, which may include one or more interconnection structures (e.g., copper interconnection lines) formed therein, as will be discussed in further detail below. The method 100 continues to operation 104 in which a sealing layer, a first etch stop layer, a first metal layer, a dummy capacitor dielectric layer, a second metal layer, and a second etch stop layer are sequentially formed over the first dielectric layer. In some embodiments, the first and second etch stop layers may be optionally formed, and are each configured to buffer a respective etching process, as will be discussed in further detail below. The method 100 continues to operation 106 in which a first patterning process is performed to simultaneously define a top metal plate of an MIM capacitor and a metal thin film of a low TCR metal resistor. In some embodiments, the top metal plate of the MIM capacitor and the metal thin film of the low TCR metal resistor may be defined (e.g., formed) by performing an etching process on the second metal layer while using a same mask layer. As such, the low TCR metal resistor, except for respective contacts, may be partially formed, according to some embodiments.

The method 100 continues to operation 108 in which a second patterning process is performed to define a capacitor dielectric layer and a bottom metal plate of the MIM capacitor. As such, the MIM capacitor, except for respective contacts, may be partially formed, according to some embodiments. The method 100 continues to operation 110 in which a second dielectric layer is formed. In some embodiments, the second dielectric layer overlays the low TCR metal resistor and the MIM capacitor. In some embodiments, similar to the first dielectric layer, the second dielectric layer may be another ILD layer that disposed above the first ILD layer (i.e., the first dielectric layer). As such, in some embodiments, the first and second dielectric layers may be referred to as first and second tiers, respectively. The method 100 continues to operation 112 in which the second dielectric layer is recessed to expose a plurality of portions of a top surface of the first etch stop layer and a portion of a top surface of the second etch stop layer. The method 100 continues to operation 114 in which the respective exposed portions of the top surfaces of the first and second etch stop layers are further recessed to expose portions of respective top surfaces of the metal thin film of the low TCR metal resistor, and the top and bottom metal plates of the MIM capacitor. The method 100 continues to operation 116 in which respective contacts for the low TCR metal resistor and MIM capacitors are formed. In some embodiments, the respective contacts may be formed by refilling the exposed portions of the respective top surfaces of the metal thin film of the low TCR metal resistor, and the top and bottom metal plates of the MIM capacitor, which will be discussed in further detail below.

As mentioned above, FIGS. 2A-2H illustrate, in a cross-sectional view, a portion of a semiconductor device 200, including at least one MIM capacitor 200-1 and one low TCR metal resistor 200-2, at various fabrication stages of the method 100 of FIGS. 1A and 1B. The semiconductor device 200 may be included in a microprocessor, memory cell, and/or other integrated circuit (IC). Also, FIGS. 2A-2H are simplified for a better understanding of the concepts of the present disclosure. Although the figures illustrate the semiconductor device 200, it is understood the IC may comprise a number of other devices such as resistors, capacitors, inductors, fuses, etc., which are not shown in FIGS. 2A-2H, for purposes of clarity of illustration.

Figure 2A:
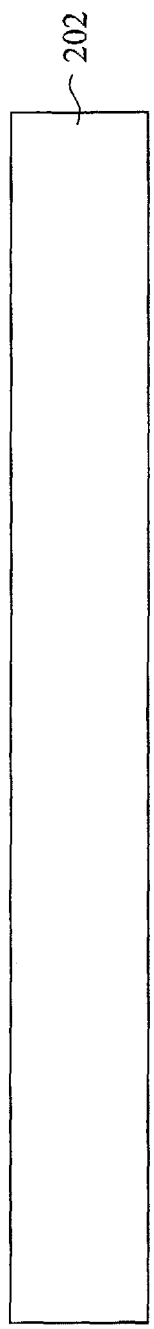
FIGS. 2A, 2B, 2C, 2D, 2E, 2F, 2G, and 2H illustrate cross-sectional views of an exemplary semiconductor device during various fabrication stages, made by the method of FIGS. 1A and 1B, in accordance with some embodiments.

Corresponding to operation 102 of FIG. 1A, FIG. 2A is a cross-sectional view of the semiconductor device 200 including a first dielectric layer 202 at one of the various stages of fabrication, in accordance with some embodiments. As mentioned above, the first dielectric layer 202 may be an ILD layer, including one or more interconnection structures, disposed at a first tier. Accordingly, below the first dielectric layer 202, one or more device features (e.g., a gate, a drain, a source of a transistor) and/or conductive features (e.g., a conduction plug), which are not shown for purposes of clarity, may be present. In some embodiments, such a first dielectric layer 202, and layers disposed above, may be collectively referred to as back-end-of-line (BEOL) layers.

In some embodiments, the first dielectric layer 202 includes a material that is at least one of the following materials, including silicon oxide, a low dielectric constant (low-k) material, other suitable dielectric material, or a combination thereof. The low-k dielectric material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

Figure 2B:
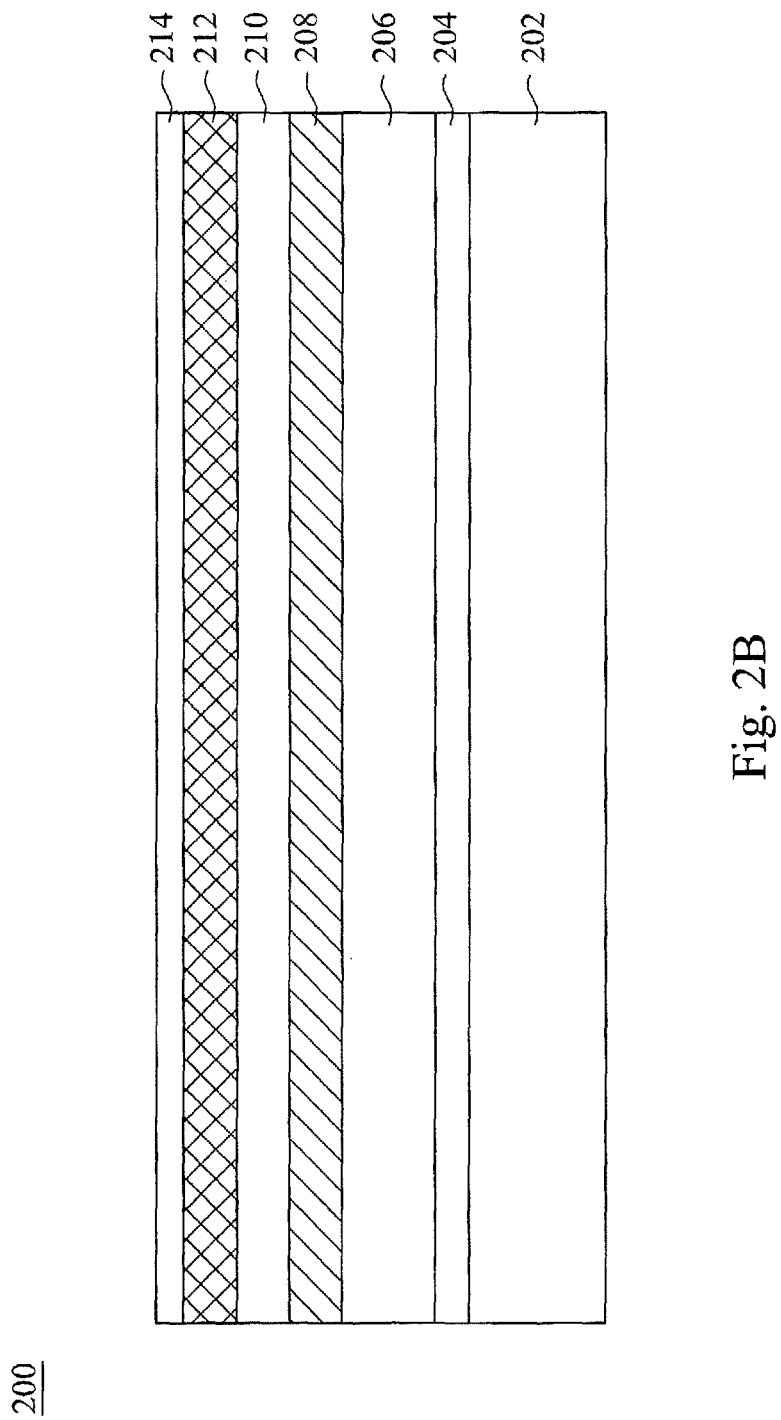

Corresponding to operation 104 of FIG. 1A, FIG. 2B is a cross-sectional view of the semiconductor device 200 including a sealing layer 204, a first etch stop layer 206, a first metal layer 208, a dummy capacitor dielectric layer 210, a second metal layer 212, and a second etch stop layer 214, which are respectively (e.g., sequentially) formed at one or more of the various stages of fabrication, in accordance with some embodiments. As shown, the sealing layer 204, the first etch stop layer 206, the first metal layer 208, the dummy capacitor dielectric layer 210, the second metal layer 212, and the second etch stop layer 214 are disposed on top of one another. More specifically, the sealing layer 204 (typically disposed between adjacent ILD layers) is disposed over the first dielectric layer 202; the first etch stop layer 206 is disposed over the sealing layer 204; the first metal layer 208 is disposed over the first etch stop layer 206; the dummy capacitor dielectric layer 210 is disposed over the first metal layer 208; the second metal layer 212 is disposed over the dummy capacitor dielectric layer 210; and the second etch stop layer 214 is disposed over the second metal layer 212.

In some embodiments, the sealing layer 204 is formed of SiN. The first and second etch stop layers 206 and 214, which may be optionally formed, are formed of SiN, SiC, SiCN, etc. The first and second metal layers 208 and 212 and formed of a metal material that is selected from at least one of: Ta, TaN, Ti, TiN, W, WN, NiCr, SiCr, and a combination thereof. The dummy capacitor dielectric layer 210 is formed of an insulating material such as, for example, $SiO_2$, $La_2O_3$, $ZrO_3$, Ba—Sr—Ti—O, $Si_3N_4$ and laminate of a mixture thereof. In some embodiments, the dummy capacitor dielectric layer 210 is formed of a high-k dielectric material such as, for example, $Al_2O_3$, $HfO_2$, etc.

In some embodiments, each of the sealing layer 204, the first etch stop layer 206, the dummy capacitor dielectric layer 210, and the second etch stop layer 214 may be respectively (e.g., sequentially) formed over the first dielectric layer 202, or a respective overlaid layer, using one of the following deposition techniques: chemical vapor deposition (CVD), physical vapor deposition (PVD), atomic layer deposition (ALD), spin-on coating, and/or other suitable dielectric material deposition techniques. In some embodiments, each of the first and second metal layers 208 and 212 may be respectively (e.g., sequentially) formed over the first dielectric layer 202, or a respective overlaid layer, using one of the following deposition techniques: e-gun, sputtering, and/or other suitable metal material deposition techniques.

Figure 2C:
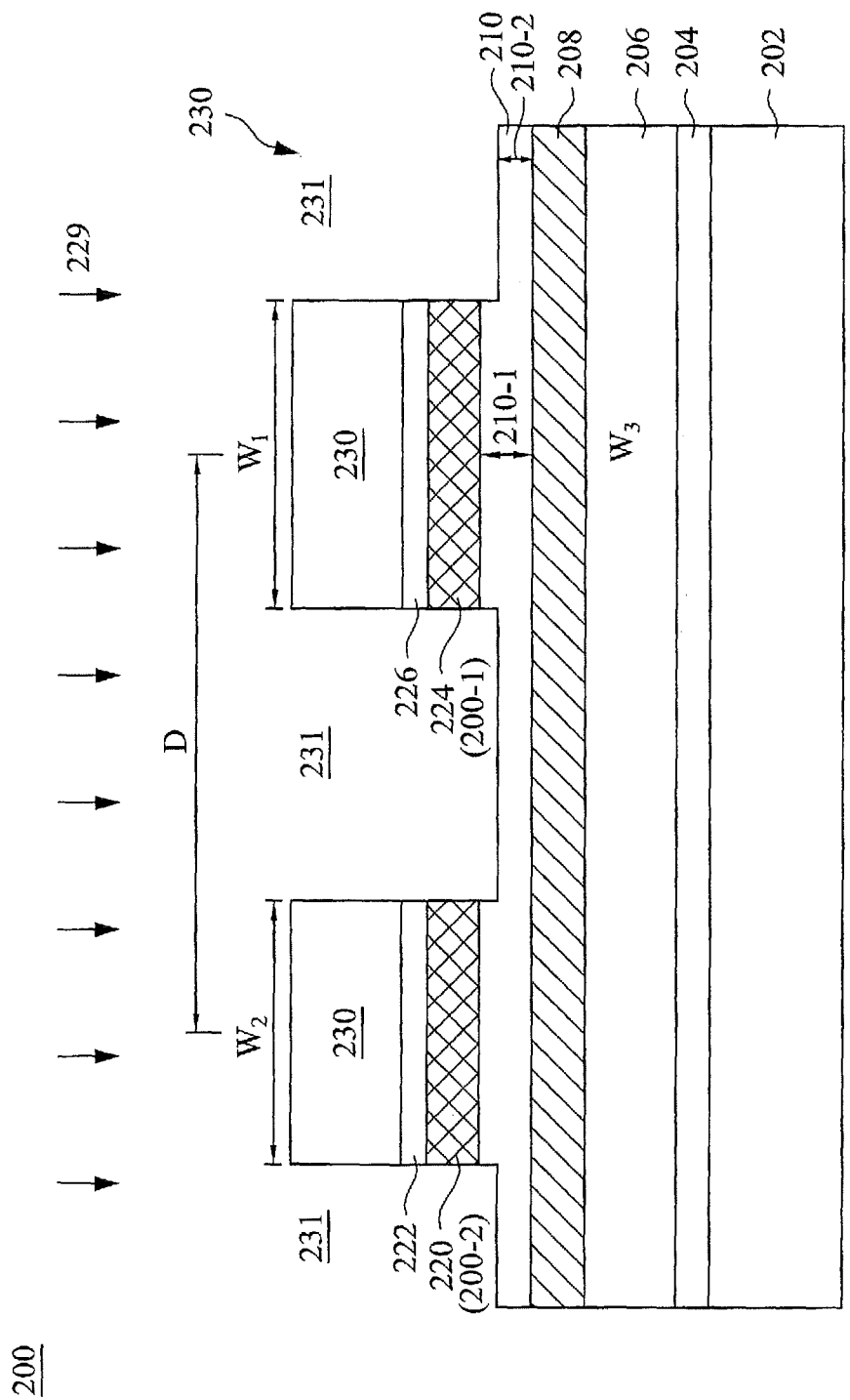

Corresponding to operation 106 of FIG. 1A, FIG. 2C is a cross-sectional view of the semiconductor device 200 including a metal thin film 220 of the low TCR metal resistor 200-2 and a top metal plate 224 of the MIM capacitor 200-1, which are simultaneously formed by etching a common metal layer (e.g., the second metal layer 212) at one of the various stages of fabrication, in accordance with some embodiments. As such, respective top surfaces of the metal thin film 220 of the low TCR metal resistor 200-2 and the top metal plate 224 of the MIM capacitor 200-1 may be substantially coplanar (i.e., aligning with the top surface of the second metal layer 212).

According to various embodiments of the present disclosure, the metal thin film 220 and the top metal plate 224 are simultaneously formed by performing at least one dry and/or wet etching process 229 on the second etch stop layer 214 and the second metal layer 212 (FIG. 2B) while using a same patternable layer (e.g., a hardmask layer, a photoresist layer, etc.) 230 as an etching mask. In particular, the patternable layer 230 includes one or more patterns (e.g., openings) 231 so as to define a lateral spacing "D" between the metal thin film 220 and the top metal plate 224, and/or respective widths of the top metal plate 224 and the metal thin film 220, "W1" and "W2." In some embodiments, when forming the metal thin film 220 and the top metal plate 224, remaining portions 222 and 226 of the second etch stop layer 214 (FIG. 2B) that are covered by the patternable layer 230 (i.e., the portions directly under the patternable layer 230) may be accordingly formed. In some embodiments, when the metal thin film 220 is formed, the low TCR metal resistor 200-2, except for respective contacts, may be partially formed.

In some embodiments, when performing the etching process 229 on the second etch stop layer 214 and the second metal layer 212 (FIG. 2B), part of an upper portion of the dummy capacitor dielectric layer 210 that is not covered by the patternable layer 230 (i.e., the portions exposed by the openings 231) may be recessed. As such, the dummy capacitor dielectric layer 210 may not have uniform thickness across its lateral span, i.e., having observable step changes in the thicknesses. In the illustrated embodiment of FIG. 2C, the dummy capacitor dielectric layer 210 has a first portion, directly below the top metal plate 224 of the MIM capacitor 200-1 (and directly below the metal thin film 220 of the low TCR metal resistor 220-2), having a thickness 210-1; and a second portion, exposed by the openings 231, having a thickness 210-2. In some embodiments, following the etching process 229, a cleaning process with the use of etchant, e.g., HF, may be performed to remove the patternable layer 230.

Figure 2D:
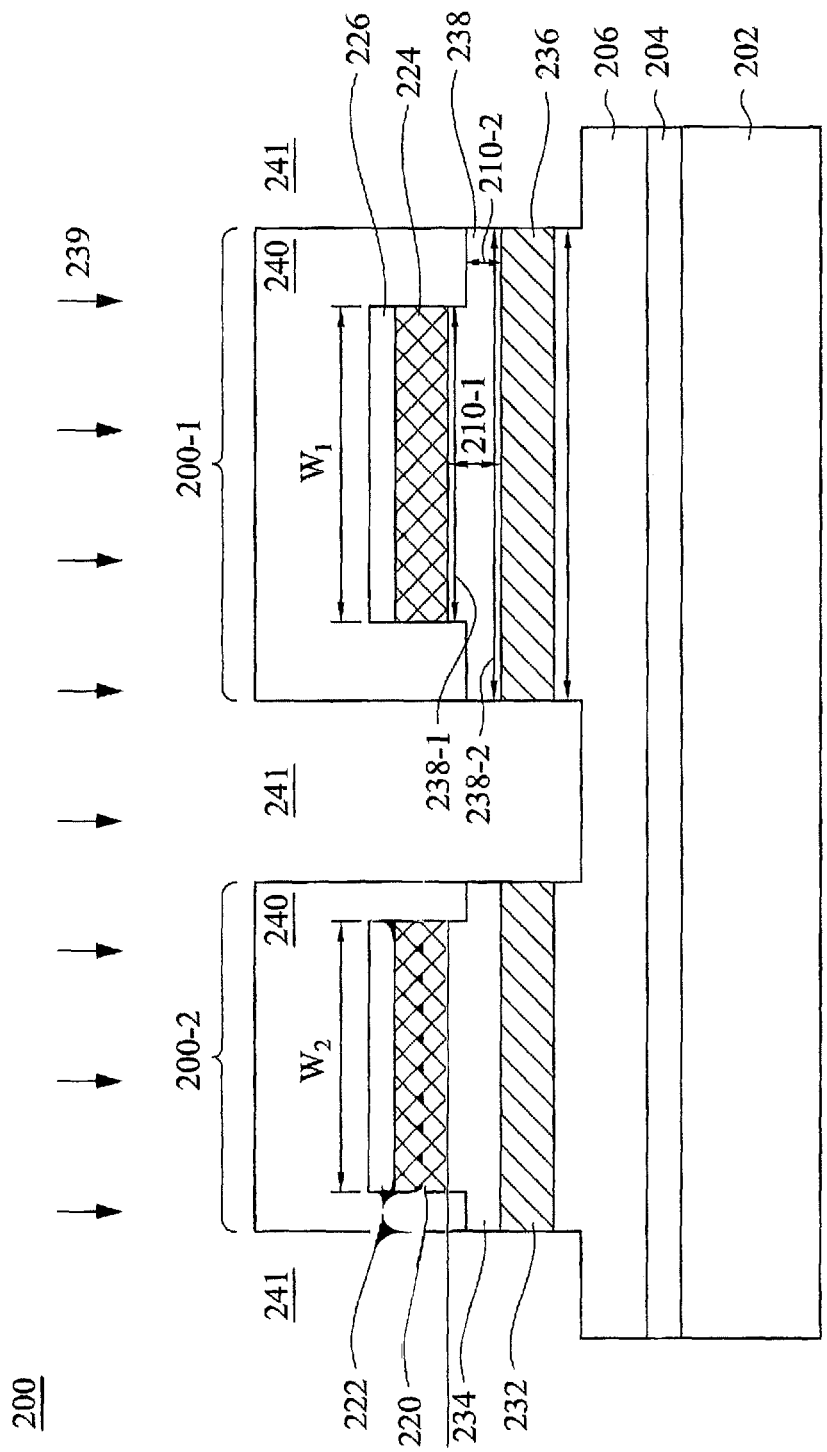

Corresponding to operation 108 of FIG. 1A, FIG. 2D is a cross-sectional view of the semiconductor device 200 including a patterned first metal layer 232 and a patterned dummy capacitor dielectric layer 234 directly below the metal thin film 220 of the low TCR metal resistor 200-2, and a bottom metal plate 236 and a capacitor dielectric layer 238 of the MIM capacitor 200-1, which are formed at one of the various stages of fabrication, in accordance with some embodiments.

According to various embodiments of the present disclosure, the patterned dummy capacitor dielectric layer 234/ capacitor dielectric layer 238, and the patterned first metal layer 232/bottom metal plate 236 are formed by performing one or more dry and/or wet etching processes 239 on the dummy capacitor dielectric layer 210 and the first metal layer 208 (FIG. 2C), respectively, while using a same patternable layer (e.g., a hardmask layer, a photoresist layer, etc.) 240 as an etching mask. In particular, the patternable layer 240 includes one or more patterns (e.g., openings) 241 so as to define a respective width of the bottom metal plate 236, "W3."

In some embodiments, because of the different thicknesses 210-1 and 210-2 present in the dummy capacitor dielectric layer 210 (FIG. 2C), part of which now becomes the capacitor dielectric layer 238, the capacitor dielectric layer 238 may have an upper width 238-1, substantially equal to W1, and a lower width 238-2, substantially equal to W3, wherein W3 is greater than W1. As such, the capacitor dielectric layer 238 and the bottom metal plate 236 may each have a portion, on each side, laterally extending beyond a vertical projection of a sidewall of the top metal plate 224. In some embodiments, such a laterally extended portion of the bottom metal plate 236 may allow a respective contact to land, which will be discussed below. In some embodiments, when the capacitor dielectric layer 238 and the bottom metal plate 236 are formed, the MIM capacitor 200-1, except for respective contacts, may be partially formed.

In some embodiments, when performing the etching process 239 on the dummy capacitor dielectric layer 210 and the first metal layer 208 (FIG. 2C), the first etch stop layer 206 may buffer (e.g., stop) the etching process 239, as mentioned above, because the first etch stop layer 206 presents a different etch selectivity from ones of the dummy capacitor dielectric layer 210 (e.g., 210-1, 210-2). In some embodiments, following the etching process 239, a cleaning process with the use of etchant, e.g., HF, may be performed to remove the patternable layer 240.

Figure 2E:
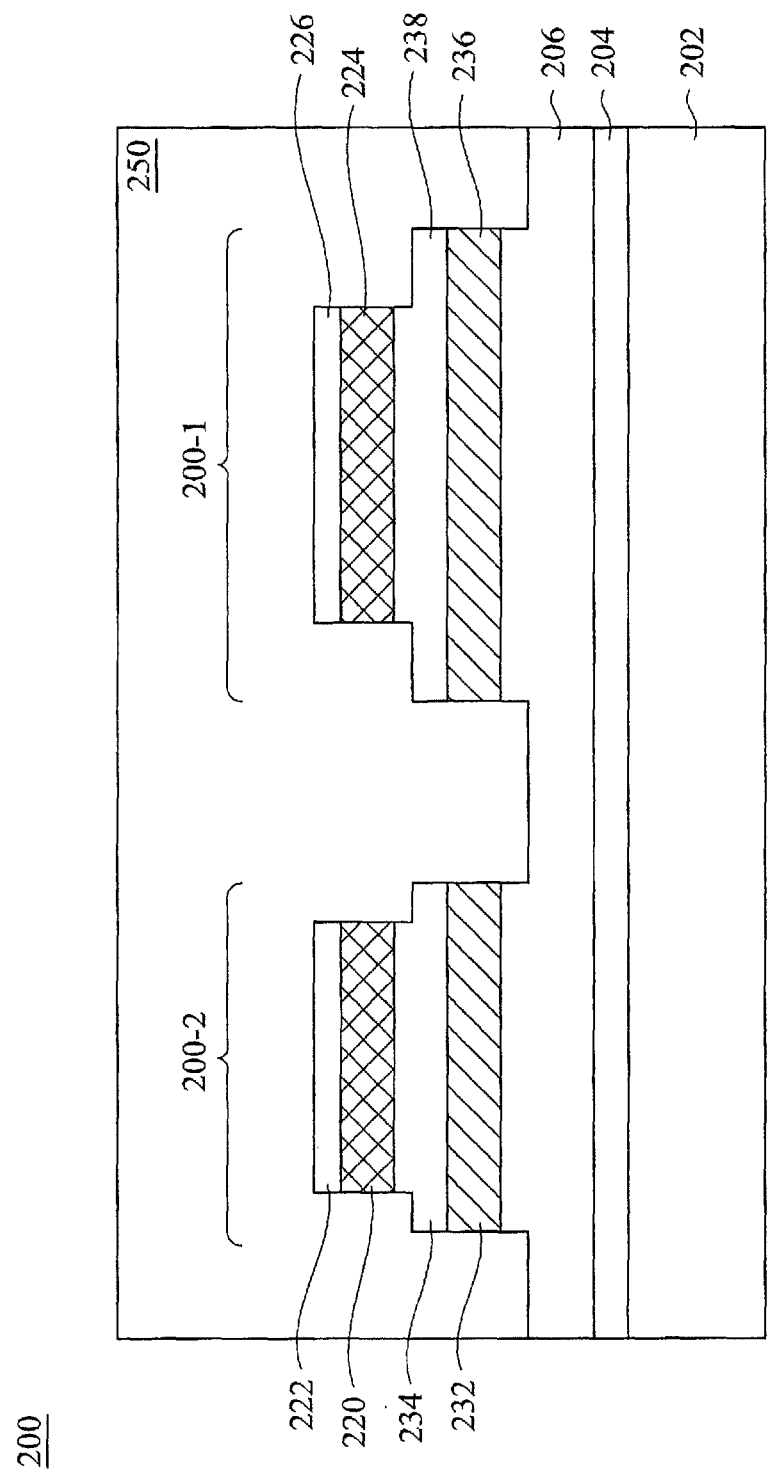

Corresponding to operation 110 of FIG. 1B, FIG. 2E is a cross-sectional view of the semiconductor device 200 including a second dielectric layer 250, which is formed at one of the various stages of fabrication, in accordance with some embodiments. As shown, the second dielectric layer 250 overlays the partially formed MIM capacitor 200-1 that includes the top metal plate 224, capacitor dielectric layer 238, and the bottom metal plate 236, and the partially formed low TCR metal resistor 200-2 that includes the metal thin film 220.

In some embodiments, the second dielectric layer 250 is formed using one of the following deposition techniques: chemical vapor deposition (CVD), physical vapor deposition (PVD), atomic layer deposition (ALD), spin-on coating, and/or other suitable dielectric material deposition techniques. In some embodiments, the second dielectric layer 250 includes a material that is at least one of the following materials, including silicon oxide, a low dielectric constant (low-k) material, other suitable dielectric material, or a combination thereof. The low-k dielectric material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

As mentioned above, the first dielectric layer 202, which may be an ILD layer, is referred to the first tier. In some embodiments, the second dielectric layer 250 may be also an ILD layer, which is referred a second tier that is disposed above the first tier (i.e., the first dielectric layer 202). Accordingly, within the second dielectric layer 250, one or more interconnection structures (e.g., copper interconnection lines) may be included while remaining within the scope of the present disclosure.

Figure 2F:
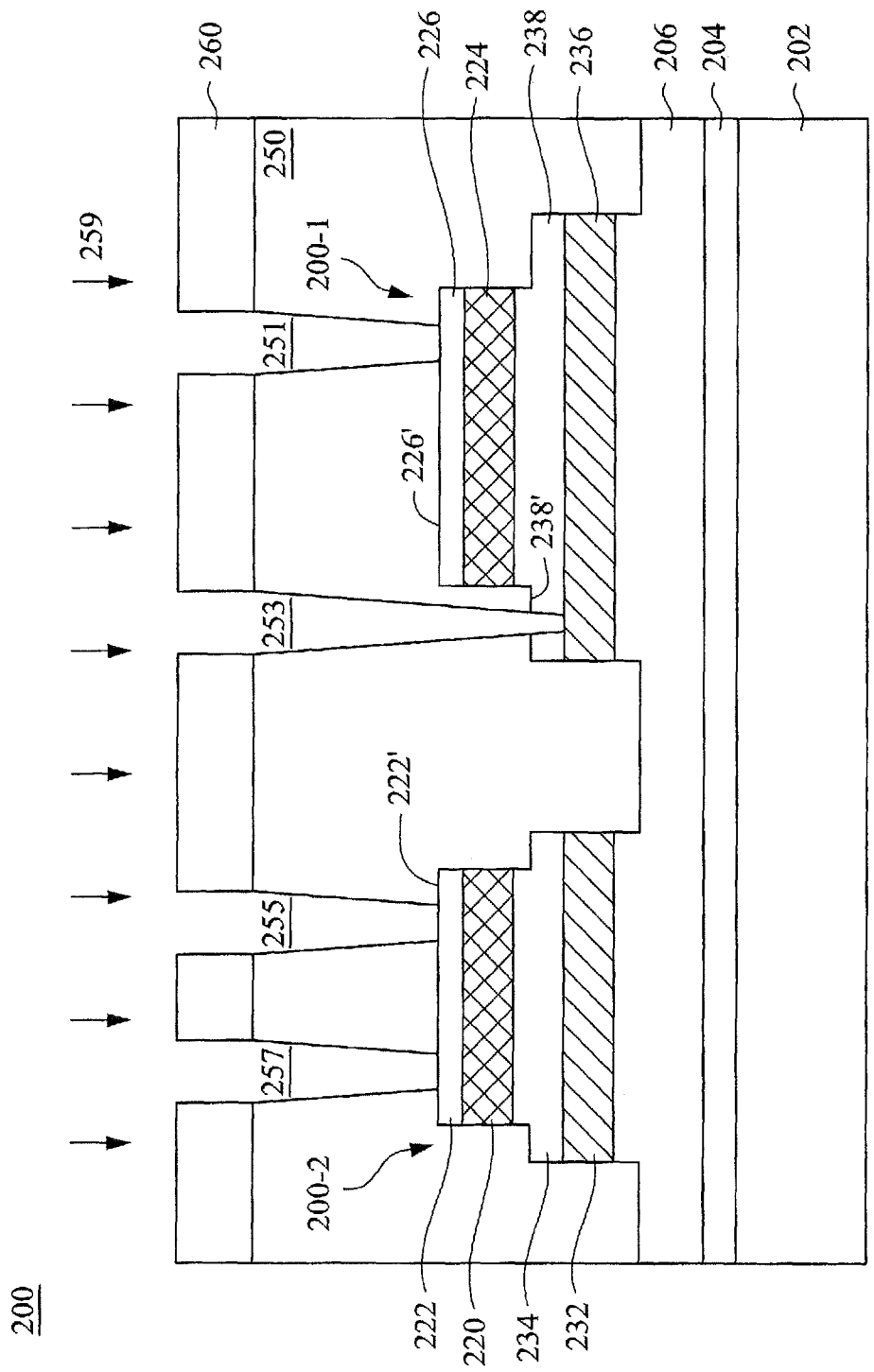

Corresponding to operation 112 of FIG. 1B, FIG. 2F is a cross-sectional view of the semiconductor device 200 in which a plurality of openings 251, 253, 255, and 257 are formed in the second dielectric layer 250 at one of the various stages of fabrication, in accordance with some embodiments. As shown, each of the openings 251-257 extends through a different portion of the second dielectric layer to expose a respective portion of a top surface of the remaining portion 222 of the second etch stop layer 214 (FIG. 2B), the remaining portion 226 of the second etch stop layer 214 (FIG. 2B), or the capacitor dielectric layer 238. More specifically, in some embodiments, the opening 251 exposes a portion of top surface 226' of the remaining portion 226; the opening 253 exposes a portion of top surface 238' of the capacitor dielectric layer 238; the opening 255 exposes a first portion of top surface 222' of the remaining portion 222; and the opening 257 exposes a second portion of the top surface 222' of the remaining portion 222. Further, in some embodiments, the first and second portions of the top surface 222', respectively exposed by the openings 255 and 257, are located at two ends of the remaining portion 222 of the second etch stop layer 214 (FIG. 2B).

In some embodiments, the openings 251-257 may be formed by performing one or more dry/wet etching processes 259 on the second dielectric layer 250 while using a patternable layer 260 as an etching mask. As mentioned above, the second etch stop layer 214 is configured to buffer an etching process. Since the remaining portions 222 and 226 are part of the second etch stop layer 214, in some embodiments, the one or more dry/wet etching processes to form the openings 251-257 may be buffered (e.g., stopped) by the remaining portions 222 and 226, respectively.

Figure 2G:
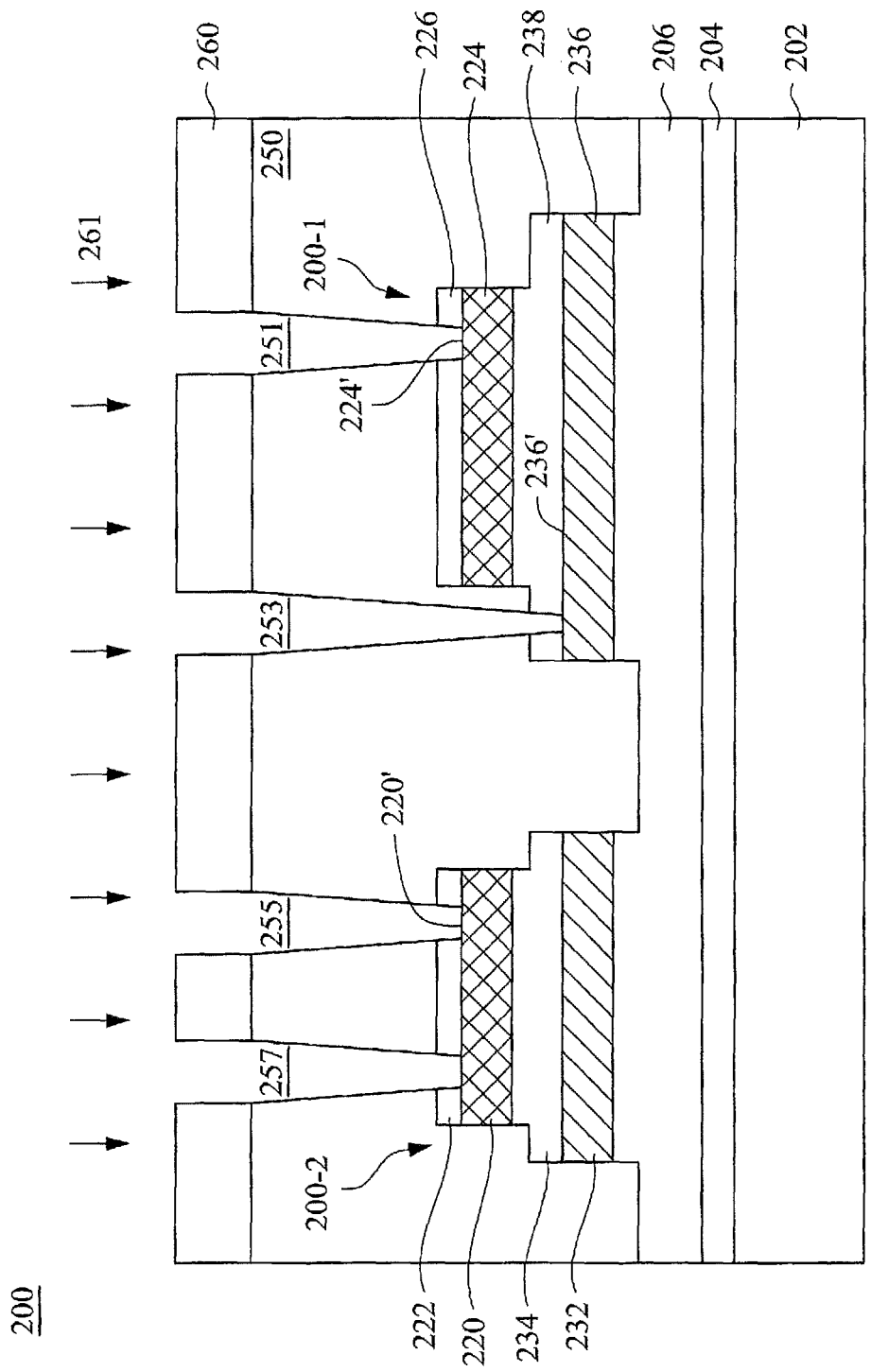

Corresponding to operation 114 of FIG. 1B, FIG. 2G is a cross-sectional view of the semiconductor device 200 in which two portions of top surface 220' of the metal thin film 220, a portion of top surface 224' of the top metal plate 224, and a portion of top surface 236' of the bottom metal plate 236 are exposed at one of the various stages of fabrication, in accordance with some embodiments. In some embodiments, the two portions of the top surface 220' of the metal thin film 220, the portion of the top surface 224' of the top metal plate 224, and the portion of the top surface 236' of the bottom metal plate 236 may be exposed by performing one or more dry/wet etching processes 261 on the remaining portion 222, the remaining portion 226, and the capacitor dielectric layer 238, respectively, while still using the patternable layer 260 as the etching mask. Further, since the patternable layer 260 is continually being used as the etching mask, in some embodiments, the two exposed portions of the top surface 220', which are substantially aligned with the exposed portions of the remaining portion 222' (FIG. 2F), are located at two ends of the metal thin film 220. In some embodiments, the etching process 261 may be associated with an etching rate higher than one associated with the etching process 259.

Figure 2H:
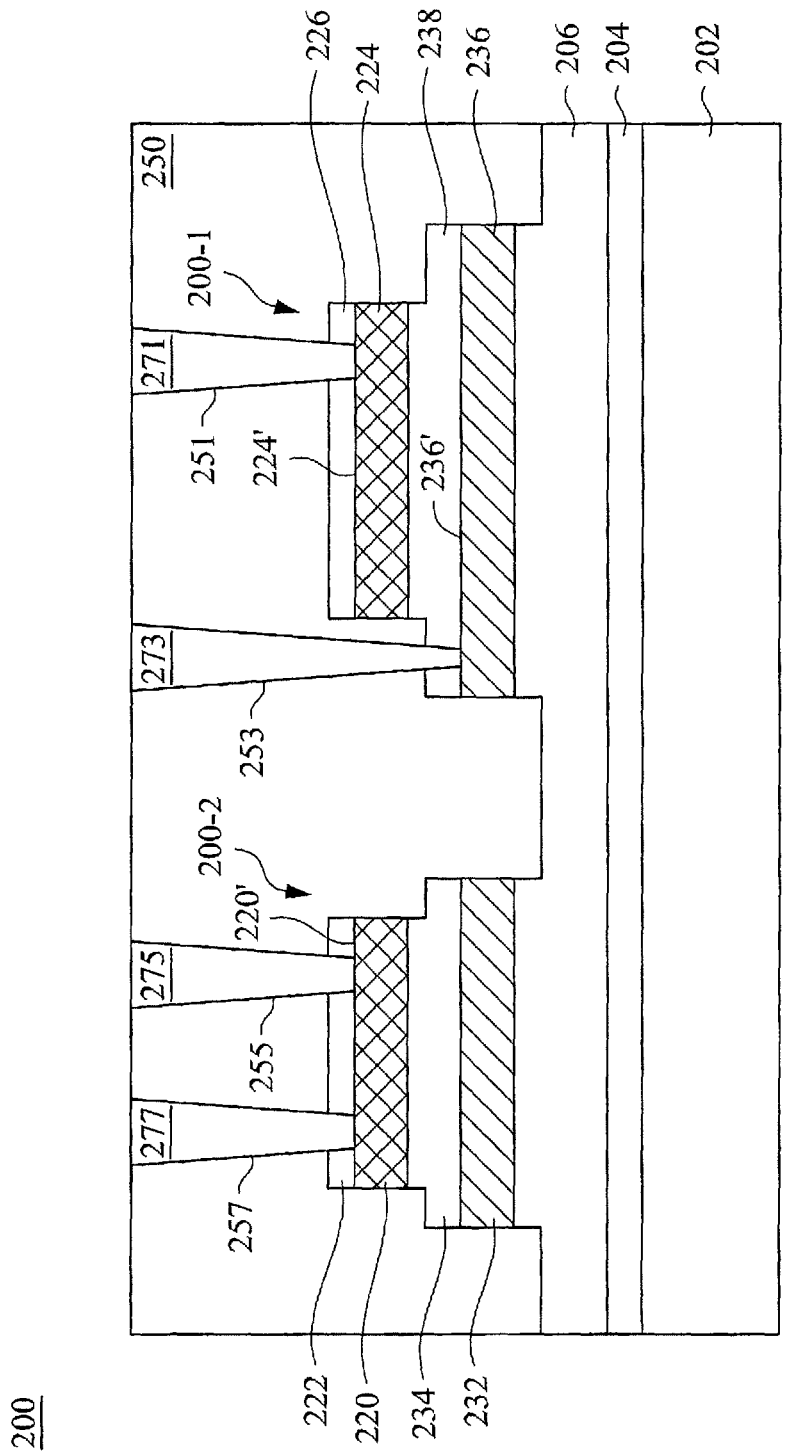

Corresponding to operation 116 of FIG. 1B, FIG. 2H is a cross-sectional view of the semiconductor device 200 including a plurality of contacts 271, 273, 275, and 277, which are formed at one of the various stages of fabrication, in accordance with some embodiments. As shown, the contact 271 couples the portion of the top surface 224' exposed by the opening 251; the contact 273 couples the portion of the top surface 236' exposed by the opening 253; and the contacts 275 and 277 respectively couple the portions of the top surface 220' exposed by the openings 255 and 257. As such, the contacts 275 and 277 may couple the metal thin film 220 at its respective ends. In some embodiments, after the contacts 271-277 are formed, the MIM capacitor 200-1 and the low TCR metal resistor 200-2 may be completely formed. That is, the contacts 271 and 273 may serve as electrical connections for the top metal plate 224 of the MIM capacitor 200-1 and the bottom metal plate 236 of the MIM capacitor 200-1, respectively, and the contacts 275 and 277 may serves as electrical connections for the low TCR metal resistor 200-2.

In some embodiments, the contacts 271-277 may each include a metal material such as, for example, copper (Cu), or the like. In some other embodiments, the contacts 271-277 may each include other suitable metal materials (e.g., gold (Au), cobalt (Co), silver (Ag), etc.) and/or conductive materials (e.g., polysilicon) while remaining within the scope of the present disclosure. In some embodiments, the contacts 271-277 may be formed using CVD, PVD, E-gun, and/or other suitable techniques to fill the respective openings 251-257 with the above-described metal, or conductive, material, and polishing out excessive metal, or conductive, material by a planarization process (e.g., chemical-mechanical polishing).

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In an embodiment, a semiconductor device includes: a capacitor that includes a first metal plate; a capacitor dielectric layer disposed over the first metal plate; and a second metal plate disposed over the capacitor dielectric layer; and a resistor that includes a metal thin film, wherein the metal thin film of the resistor and the second metal plate of the capacitor are formed of a same metal material and wherein a top surface of the metal thin film is substantially coplanar with a top surface of the second metal plate of the capacitor.

In another embodiment, a semiconductor device includes: a capacitor and a resistor. The capacitor includes: a bottom metal plate, a capacitor dielectric layer, and a top metal plate, wherein the capacitor dielectric layer is sandwiched between the bottom and top metal plates. The resistor includes a metal thin film, wherein the metal thin film of the resistor and the top metal plate of the capacitor are simultaneously formed from a same patterning process.

In yet another embodiment, a method includes: providing a first dielectric layer; sequentially forming a first metal layer, a dummy capacitor dielectric layer, and a second metal layer over the first dielectric layer; and using a single mask layer with two patterns to simultaneously recess two portions of the second metal layer so as to define a metal thin film of a resistor and a top metal plate of a capacitor.

What is claimed is:

1. A method, comprising:
   providing a first dielectric layer;
   forming a first metal layer and a second metal layer over the first dielectric layer;
   using a single mask layer with two patterns to simultaneously recess two portions of the second metal layer so as to define a metal thin film of a resistor, a top metal plate of a capacitor and a bottom metal plate of the capacitor;
   forming a first etch stop layer below the bottom metal plate; and
   forming a second etch stop layer comprising a first portion disposed on a top surface of the metal thin film and a second portion disposed on a top surface of the top metal plate, wherein the first portion, metal thin film, the second portion and the top metal plate are formed using a single first etching mask.

2. The method of claim 1, further comprising:
   recessing the dummy capacitor dielectric layer and the first metal layer so as to define a capacitor dielectric layer and a bottom metal plate of the capacitor.

3. The method of claim 2, further comprising:
   forming at least a first contact and a second contact, extending through a second dielectric layer, to couple the bottom and top metal plates of the capacitor, respectively; and
   forming at least a third contact and a fourth contact, extending through the second dielectric layer, to couple the metal thin film of the resistor,
   wherein the second dielectric layer is formed above the first dielectric layer.

4. The method of claim 1, wherein the patterned dielectric layer, the capacitor dielectric layer, the patterned metal layer and bottom metal plate are formed using a single second etching mask.

5. The method of claim 4, further comprising:
   forming a first dielectric layer over the capacitor and the resistor, the first dielectric layer having a portion that extends between the capacitor and the resistor into the first etch stop layer;
   forming a second dielectric layer below the first dielectric layer; and
   forming a sealing layer disposed between the first etch stop layer and the second dielectric layer, wherein the sealing layer comprises silicon nitride.

6. A method of making a semiconductor device, comprising:
   forming a bottom metal plate over a substrate;
   forming a capacitor dielectric layer over the bottom metal plate;
   forming a top metal plate over the capacitor dielectric layer;
   forming a metal thin film of a resistor with the top metal plate, wherein the metal thin film of the resistor and the top metal plate of the capacitor are formed of a same metal material, wherein the metal thin film is formed over a patterned dielectric layer, and wherein the patterned dielectric layer is formed over a patterned metal layer, the patterned metal layer being simultaneously formed of a same material as the bottom metal plate;
   forming a first etch stop layer below the patterned metal layer and the bottom metal plate; and
   forming a second etch stop layer disposed on a portion of the top surface of the top metal plate and on a portion of a top surface of the metal thin film, wherein the first and the second etch stop layers are each configured to buffer a respective etching process, wherein the second etch stop layer comprises a first portion disposed on the top surface of the metal thin film and a second portion disposed on the top surface of the top metal plate, wherein the first portion, metal thin film, the second portion and the top metal plate are formed using a single first etching mask.

7. The method of claim 6, wherein the patterned dielectric layer, the capacitor dielectric layer, the patterned metal layer and bottom metal plate are formed using a single second etching mask.

8. The method of claim 7, further comprising:
   forming a first dielectric layer over the capacitor and the resistor, the first dielectric layer having a portion that extends between the capacitor and the resistor into the first etch stop layer;
   forming a second dielectric layer below the first dielectric layer; and
   forming a sealing layer between the first etch stop layer and the second dielectric layer, wherein the sealing layer comprises silicon nitride.

9. The method of claim 8, wherein the first and second dielectric layers are each formed of a low-k dielectric material.

10. The method of claim 8, further comprising:
    forming a first contact, extending through the first dielectric layer, coupled to a portion of the planar top surface of the bottom metal plate of the capacitor; and
    forming a second contact, extending through the first dielectric layer, coupled to a portion of a planar top surface of the top metal plate of the capacitor.

11. The method of claim 10, further comprising:
    forming a third contact, extending through the first dielectric layer, coupled to a first portion of the top surface of the metal thin film of the resistor; and
    forming a fourth contact, extending through the first dielectric layer, coupled to a second portion of the top surface of the metal thin film of the resistor.

12. The method of claim 7, wherein the first and second portions are located on both ends of the metal thin film of the resistor, respectively.

13. A method of making a semiconductor device, comprising:
    forming a capacitor comprising: a bottom metal plate, a capacitor dielectric layer, and a top metal plate, wherein the capacitor dielectric layer is sandwiched between the bottom and top metal plates;
    forming a resistor comprising a metal thin film, wherein the metal thin film is formed over a patterned dielectric layer, and wherein the patterned dielectric layer is formed over a patterned metal layer, the patterned metal layer being formed of a same material as the bottom metal plate;
    forming a first etch stop layer below the patterned metal layer and the bottom metal plate; and
    forming a second etch stop layer on a portion of a top surface of the top metal plate and on a portion of a top surface of the metal thin film, wherein the first and the second etch stop layers are each configured to buffer a respective etching process, wherein the second etch stop layer comprises a first portion disposed on the top surface of the metal thin film and a second portion disposed on the top surface of the top metal plate, and wherein the patterned dielectric layer, the capacitor dielectric layer, the patterned metal layer and bottom metal plate are formed using a single second etching mask.

14. The method of claim 13, further comprising:
forming a first dielectric layer over the capacitor and the resistor, the first dielectric layer having a portion that extends between the capacitor and the resistor into the first etch stop layer;
forming a second dielectric layer below the first dielectric layer; and
forming a sealing layer between the first etch stop layer and the second dielectric layer, wherein the sealing layer comprises silicon nitride.

15. The method of claim 13, wherein the metal thin film of the resistor and the top metal plate of the capacitor are formed of a same metal material.

16. The method of claim 15, wherein the same metal material is selected from at least one of: Ta, TaN, Ti, TiN, W, WN, NiCr, SiCr, and a combination thereof.

17. The method of claim 15, wherein the first and second dielectric layers are each formed of a low-k dielectric material.

18. The method of claim 13, further comprising:
forming a first contact, extending through the first dielectric layer, coupled to a portion of the planar top surface of the top metal plate of the capacitor; and
forming a second contact, extending through the first dielectric layer, coupled to a portion of a planar top surface of the bottom metal plate of the capacitor.

19. The method of claim 13, further comprising:
forming a third contact, extending through the first dielectric layer, coupled to a first portion of a top surface of the metal thin film of the resistor; and
forming a fourth contact, extending through the first dielectric layer, coupled to a second portion of the top surface of the metal thin film of the resistor.

20. The method of claim 13, wherein the capacitor dielectric layer is formed of a material selected from at least one of: $Al_2O_3$, $HfO_2$, $SiO_2$, $La_2O_3$, $ZrO_3$, Ba—Sr—Ti—O, $Si_3N_4$, and a combination thereof.

* * * * *